United States Patent
Yamamoto et al.

(10) Patent No.: US 8,304,021 B2
(45) Date of Patent: Nov. 6, 2012

(54) VAPOR PHASE DEPOSITION APPARATUS, METHOD FOR DEPOSITING THIN FILM AND METHOD FOR MANUFACTURING SEMICONDUCTOR DEVICE

(75) Inventors: Tomoe Yamamoto, Kawasaki (JP); Tomohisa Iino, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 82 days.

(21) Appl. No.: 12/561,836

(22) Filed: Sep. 17, 2009

(65) Prior Publication Data
US 2010/0003832 A1  Jan. 7, 2010

Related U.S. Application Data

(62) Division of application No. 11/141,018, filed on Jun. 1, 2005, now abandoned.

(30) Foreign Application Priority Data

Jun. 2, 2004 (JP) ................................. 2004-164124

(51) Int. Cl.
*C23C 16/16* (2006.01)
*C23C 16/18* (2006.01)
*C23C 16/52* (2006.01)
*C23F 1/00* (2006.01)
*H01L 21/36* (2006.01)
*C23C 16/44* (2006.01)

(52) U.S. Cl. ................. 427/248.1; 427/249.19; 438/683; 438/685; 118/666; 118/724; 156/345.27; 156/345.24; 156/345.37

(58) Field of Classification Search ............... 427/248.1, 427/249.19; 438/683, 685; 118/666, 724, 118/715; 156/345.27, 345.24, 345.37
See application file for complete search history.

(56) References Cited

U.S. PATENT DOCUMENTS

| 5,211,731 | A | * | 5/1993 | Busse et al. | 65/388 |
| 5,629,229 | A | * | 5/1997 | Si et al. | 438/3 |
| 5,728,222 | A | * | 3/1998 | Barbee et al. | 118/715 |
| 5,730,804 | A | * | 3/1998 | Gomi et al. | 118/726 |
| 6,136,725 | A | * | 10/2000 | Loan et al. | 438/758 |
| 6,274,195 | B1 | | 8/2001 | Rhee et al. | |
| 6,296,711 | B1 | * | 10/2001 | Loan et al. | 118/726 |

(Continued)

FOREIGN PATENT DOCUMENTS

| JP | 2000-133644 A | 5/2000 |
| JP | 2000-282242 A | 10/2000 |
| WO | 2004/040630 A1 | 5/2004 |

*Primary Examiner* — Rudy Zervigon
(74) *Attorney, Agent, or Firm* — Sughrue Mion, PLLC

(57) ABSTRACT

A vapor phase deposition apparatus 100 for forming a thin film comprising a chamber 1060, a piping unit 120 for supplying a source material of the thin film into the chamber 1060 in a gaseous condition, a vaporizer 202 for vaporizing the source material in a source material container 112 and supplying the vaporized gas in the piping unit 120 and a temperature control unit 180, is presented. The temperature control unit 180 comprises: a first temperature control unit 174, which is composed of a heater controller unit 172 and a tape heater 170 and is capable of controlling the temperature of the first piping 116 in the piping unit 120 that is directly connected to the chamber 1060; a second temperature control unit 176, which is composed of a heater controller unit 168 and a tape heater 166 and is capable of controlling the temperature of the second piping 114 that is connected to the vaporizer; and a third temperature control unit 178, which is composed of a heater controller unit 167 and a thermostatic chamber 153 and is capable of controlling the temperature of the valve 159.

19 Claims, 11 Drawing Sheets

U.S. PATENT DOCUMENTS 6,428,850 B1 * 8/2002 Shinriki et al. .......... 427/255.32
7,007,933 B2 * 3/2006 Lee et al. ................... 261/121.1
2007/0042119 A1 * 2/2007 Matthysse et al. ......... 427/248.1

* cited by examiner

VAPOR PHASE DEPOSITION APPARATUS, METHOD FOR DEPOSITING THIN FILM AND METHOD FOR MANUFACTURING SEMICONDUCTOR DEVICE

This application is a divisional application of U.S. application Ser. No. 11/141,018 filed Jan. 6, 2005 which claims priority based on Japanese Patent Application No. 2004-164124 filed Feb. 6, 2004. The entire disclosures of the prior applications are hereby incorporated by reference.

This application is based on Japanese patent application No. 2004-164,124, the content of which is incorporated hereinto by reference.

BACKGROUND OF THE INVENTION

1. Field of the Invention

The present invention relates to a vapor phase deposition apparatus, a method for depositing a thin film and a method for manufacturing a semiconductor device.

2. Related Art

In recent years, various innovations on methods for supplying a source gas into a chamber, or in other words, innovations on piping units, are actively made for the purpose of providing a stable growth or deposition of a thin film having improved quality with a vapor phase deposition apparatus. Typical example of such techniques includes a technique disclosed in Japanese Patent Laid-Open No. 2000-282,242.

Japanese Patent Laid-Open No. 2000-282,242 describes a technique for controlling a temperature such that a temperature through a piping from an outlet of a vaporizer to a chamber are uniformity maintained in consideration of nature of a deposition source gas to generate thin film.

SUMMARY OF THE INVENTION

However, it has now been discovered that an unwanted phenomenon of generating particles on the deposited thin film has often been found in the vapor phase deposition apparatus described in Japanese Patent Laid-Open No. 2000-282, 242. The present inventors have investigated a cause thereof, and have found that the phenomenon is occurred by the following reasons.

A valve is provided in a mid way of the piping that connects the chamber to the vaporizer in the conventional vapor phase deposition apparatus, for providing an appropriate process sequence for depositing a thin film. In the conventional vapor phase deposition apparatus, the temperatures of the whole piping are controlled by one temperature control unit including such valve. However, the valve has relatively larger volume, and thus has a structure that is difficult to be heated. Therefore, it is difficult to provide a sufficient heat to the interior of the valve to maintain thereof at a preset temperature, and thus condensation of the source gas is occurred. As a result, the structure thereof includes a problem, which inherently promotes generating particles.

According to the present invention, there is provided a vapor phase deposition apparatus for forming a thin film, comprising: a chamber; a vaporizing unit that vaporizes a source material for the thin film to generate a source gas; a piping unit provided between the chamber and the vaporizing unit; and a temperature control unit that controls temperature of the piping unit, wherein the piping unit includes: a first piping connected to the chamber, a second piping connected to the vaporizing unit, and a valve provided between the first piping and the second piping, and wherein the temperature control unit is configured to conduct a temperature control for the valve independently from at least one of temperature controls for the first piping and for the second piping.

The vapor phase deposition apparatus according to the present invention is configured to be capable of conducting the temperature control for the valve provided along the piping connecting the chamber with the vaporizing unit independently from the temperature control for the piping.

Such configuration allows maintaining the temperature in the valve at desirably higher temperature. Thus, the condensation of the source gas in the valve is inhibited, and the generation of the particles on the thin film is inhibited.

According to the present invention, there is provided a method for forming a thin film by employing the vapor phase deposition apparatus according to the present invention, comprising: vaporizing a source material by the vaporizing unit to generate a source gas; introducing the source gas from the vaporizing unit into the chamber through the piping unit; and depositing a thin film from the source gas in the chamber, wherein the introducing the source gas further comprises controlling temperature of the valve independently from at least one of the first piping and the second piping by using the temperature control unit.

According to the present invention, there is provided a method for manufacturing a semiconductor device by employing the vapor phase deposition apparatus according to the present invention, comprising: vaporizing a source material by using the vaporizing unit to generate a source gas; introducing the source gas from the vaporizing unit into the chamber through the piping unit; and depositing a thin film with the source gas onto a semiconductor substrate in the chamber, wherein the introducing the source gas further comprises controlling temperature of the valve independently from at least one of the first piping and the second piping by using the temperature control unit.

Since, in the method for forming the thin film and the method for manufacturing the semiconductor device according to the present invention, the vapor phase deposition apparatus comprising the above-described configuration is employed, the temperature in the valve can be maintained at desirably higher temperature. Thus, the condensation of the source gas in the valve is inhibited, and the generation of the particles on the thin film is inhibited. As a result, the thin film and the semiconductor device having improved quality can be stably obtained.

While the aspects of present invention have been described as above, it is to be understood that any combination of such aspects is also included in the scope of the present invention. In addition, any conversion of the expressions included in the present invention into another category is also duly included in the scope of the present invention.

According to the present invention, the generation of the particles during the deposition of the thin film in the vapor phase deposition apparatus can be inhibited.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments according to the present invention will be described as follows in further detail, in reference to the annexed figures. In all figures, identical numeral is assigned to an element commonly appeared in the figures, and the detailed description thereof will not be presented.

First Embodiment

Figure 1:
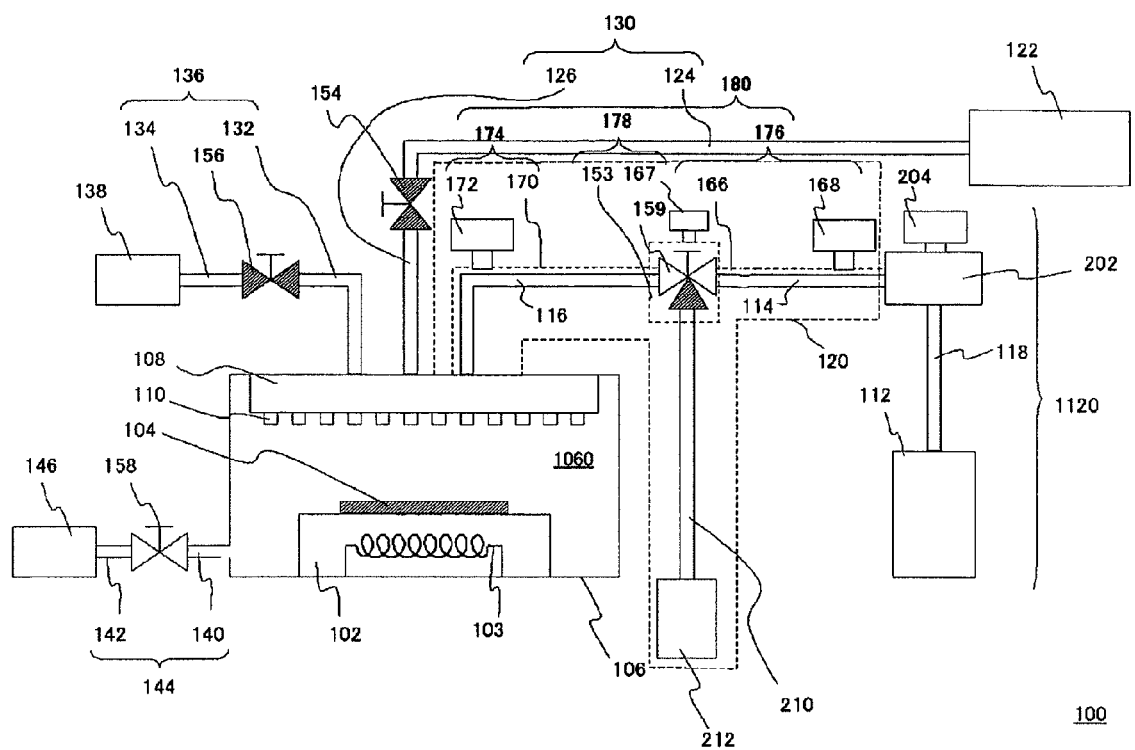
FIG. 1 is a schematic cross-sectional view of a vapor phase deposition apparatus of an embodiment according to the present invention, illustrating a configuration in introducing a first source gas.

FIG. 1 shows a vapor phase deposition apparatus according to the present embodiment.

The vapor phase deposition apparatus 100 according to the present embodiment is a type of a vapor phase deposition apparatus for forming a thin film, and comprises a chamber 1060, a vaporizing unit (source supplying section 1120) that is capable of vaporizing a source material for thin film to generate a source gas, a piping unit 120 provided between the chamber and the vaporizing unit and a temperature control unit 180 for controlling the temperature of the piping unit 120.

The piping unit 120 comprises a first piping 116 connected to the chamber 1060, a second piping 114 connected to the vaporizing unit and a valve 159 provided between the first piping 116 and the second piping 114.

The temperature control unit 180 includes a first temperature control unit 174 that is capable of controlling the temperature of the first piping 116 connected to the chamber 1060 among the piping unit 120 and comprises a heater controller unit 172 and a tape heater 170, a second temperature control unit 176 that is capable of controlling the temperature of the second piping 114 connected to the vaporizer and comprises a heater controller unit 168 and a tape heater 166, and a third temperature control unit 178 that is capable of controlling the temperature of the valve 159 and comprises a heater controller unit 167 and a thermostatic chamber 153.

The temperature control unit 180 is configured to control the temperature of the valve 159 independently from the temperature controls for at least one of the first piping 116 and the second piping 114.

Since the vapor phase deposition apparatus 100 according to the present embodiment has the above-described configuration, the temperature in the valve can be maintained at desirably higher temperature. Thus, the condensation of the source gas (process gas) in the valve 159 is inhibited, and the generation of the particles on the thin film is inhibited.

More specifically, the vapor phase deposition apparatus 100 comprises a chamber 1060 surrounded by chamber walls 106, a source supplying unit 1120 and a piping unit 120 provided therebetween. The source supplying unit 1120 is maintained at a room temperature, and includes a source container 112, which is capable of storing therein a source material such as tetraethyl methyl amino zirconium (TEMAZ) in a liquid condition, and the source material is supplied into a vaporizer 202 through the piping 118. The temperature control of the vaporizer 202 is conducted by a temperature control unit 204. Further, while the present embodiment illustrates the exemplary configuration that the temperature of the source container 112 is not under any control and spontaneously maintained at the room temperature, another configuration of conducting temperature control for the source container 112 may also be employed.

The piping unit 120 comprises the first piping 116 connected to the chamber 1060 and the second piping 114 connected to the vaporizer 202, and the second piping 114 is connected to the first piping 116 via the valve 159. In the present embodiment, the valve 159 is a three-way valve, and one port, which is not connected to the second piping 114 or the first piping 116, is connected to a source exhaust pipe 210 functioning as a source exhaust unit, and a source exhaust 212 is provided at a further location. The presences of the valve 159 and the source exhaust unit allow exhausting the residual source material remaining within the second piping 114 to the outside of the piping unit 120 while the source material is not supplied into the chamber 1060. Therefore, a decomposition of the residual source material remaining within the second piping 114 can be inhibited.

Further, in the piping unit 120, the tape heater 170 is provided around the first piping 116 that is connected to the chamber 1060. The tape heater 170 is controlled by the heater controller unit 172. Similarly, the tape heater 166 is provided around the second piping 114 that is connected to the vaporizer 202. The tape heater 166 is controlled by the heater controller unit 168.

In addition, the valve 159 is housed within a thermostatic chamber 153 (having an equivalent temperature control-ability as the tape heater has) separately from the tape heater 170 and the tape heater 166, and is controlled by the heater controller unit 167. In that way, the temperature of the valve 159 can be suitably controlled independently from the temperatures of the second piping 114 and the first piping 116, and the temperatures of the second piping 114 and the first piping 116 can also be independently controlled. Therefore, a quantity of heat supplied to the valve 159 can be selected to be different from the quantity of heat supplied to the second piping 114 and the first piping 116. More specifically, larger quantity of heat, which is larger than the heat supplied to the second piping 114 and the first piping 116, can be supplied to the valve 159, which is otherwise relatively easier to be cooled as compared with the second piping 114 and the first piping 116. Therefore, the decrease of the temperature of the valve 159 down to a level that is lower than the temperatures of the second piping 114 and the first piping 116 can be prevented.

A source material for depositing the thin film (for example, TEMAZ) is transferred from the source material container 112 though the piping 118 and introduced into the vaporizer 202 in a form of a liquid, and the introduced source material is heated to be vaporized in the vaporizer 202.

The TEMAZ gas that is vaporized in the vaporizer 202 is then transferred through the second piping 114, the valve 159 and the first piping 116, and then introduced into the chamber 1060 from perforations 110 of a showerhead 108 of the chamber 1060.

The interior of the chamber 1060 is provided with a supporting member 102 comprising a heater 103, on which a semiconductor wafer 104, for example, is mounted and heated. The above-mentioned source gas and other source gases, an oxidizing gas and a purge gas are sprayed from the perforations 110 of the shower head 108 in accordance with a predetermined sequence to deposit a thin film on the semiconductor wafer 104.

In addition, in the lower part of the chamber 1060 is provided with an outlet piping 144 and an outlet port 146 communicated with the outlet piping 144 to form a configuration of exhausting is the gas that has been introduced into the chamber 1060. A valve 158 is provided along the outlet piping 144 to provide a control for opening and closing of the outlet piping 144. The outlet piping 144 is branched at the valve 158 into an outlet piping 140 in vicinity of the chamber and an outlet piping 142 remote from the chamber.

The shower head 108 is provided with a source material supplying piping 130, which is communicated to the source material container 122. A piping 126, which is provided with a valve 154 and connected to the chamber, is provided in the source material supplying piping 130. The piping 124 remote from the chamber, which is connected to the source material container 122, is provided in the opposite side of the shower head 108 opposite to the valve 154 in the source material supplying piping 130.

Further, the shower head 108 is communicated with a purge gas inlet 138 through a purge gas supplying piping 136. The purge gas supplying piping 136 is provided with a valve 156. A piping 132 extended between the valve 156 and the shower head 108 constitutes one side of the purge gas supplying piping 136 on the chamber-proximal side. A piping 134 extended between the valve 156 and purge gas inlet 138 also constitutes the other side of the purge gas supplying piping 136 on the chamber-remote side.

Figure 5:
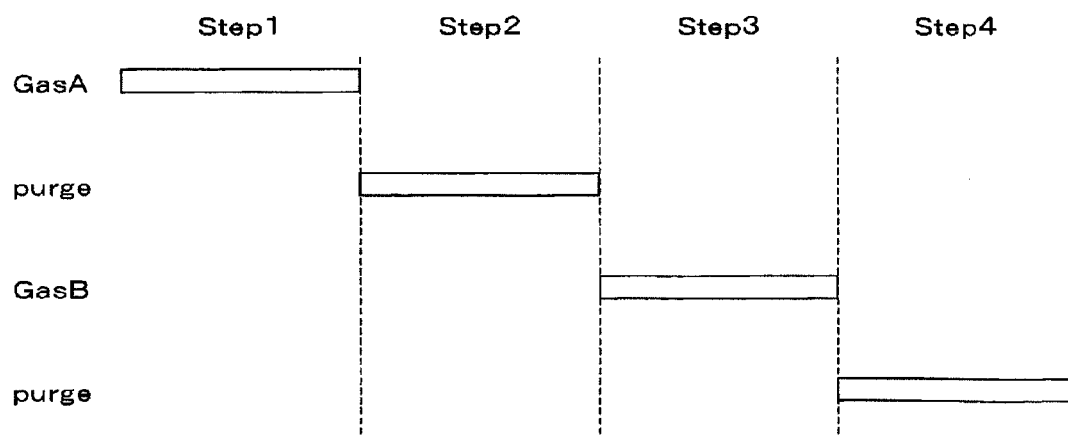
FIG. 5 is a chart, showing an example of a process sequence for manufacturing a thin film by employing the vapor phase deposition apparatus according to the embodiment.

A process sequence for manufacturing a thin film using such vapor phase deposition apparatus will be described. FIG. 5 is a timing chart, showing an example of a process sequence for manufacturing a thin film by employing a vapor phase deposition apparatus 100 according to the first embodiment.

As described above, a first source gas ("gas A") is introduced to deposit a thin film by using the vapor phase deposition apparatus 100 in accordance with an operation shown in FIG. 1, as a first forming process step (step 1). Next, a purge gas ("purge") is introduced in accordance with FIG. 2, as a second forming process step (step 2). Then, a second source gas ("gas B") is introduced in accordance with FIG. 3, as a third forming process step (step 3). Subsequently, a purge gas ("purge") is introduced in accordance with FIG. 4, as a fourth forming process step (step 4). Operations in accordance with FIG. 1 to FIG. 3 will be described later.

Repetition of the deposition using a chemical vapor deposition (CVD) or an atomic layer deposition (ALD) is conducted by repeating such sequence to obtain a thin film having a desired film thickness. In such case, repetition number of the sequence may be suitably selected and other additional forming processes may be included, depending upon the purposes.

Figure 8A:
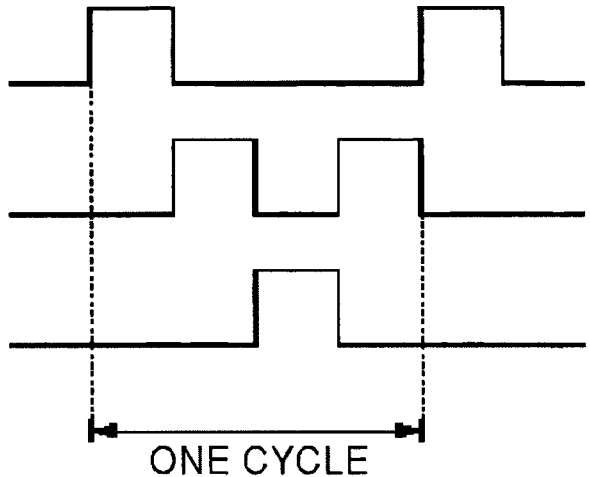
FIG. 8A is a time chart for illustrating a process sequence for depositing an oxide film.
Figure 8B:
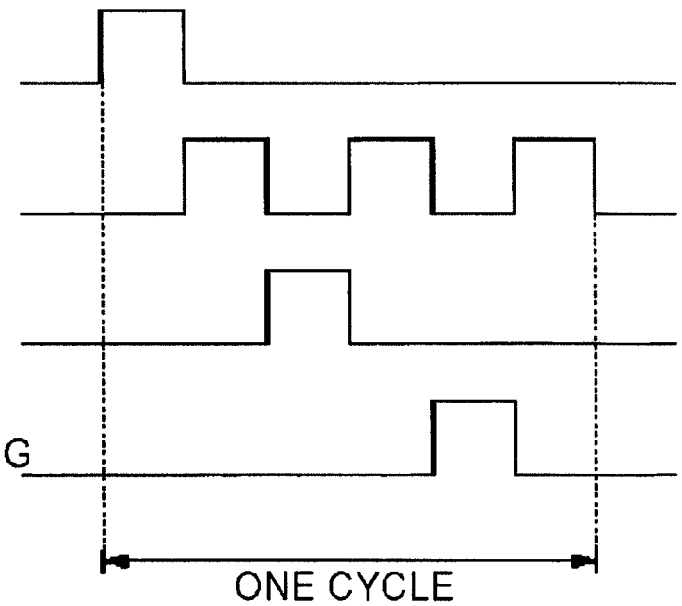
FIG. 8B is a time chart for illustrating a process sequence for depositing an oxynitride film.

More specifically, an exemplary example may be conducted in accordance with a process sequence of, for example, FIG. 8A or FIG. 8B. FIG. 8A is a timing chart, showing an example of a process sequence for depositing an oxide film, and FIG. 8B is a timing chart, showing an example of a process sequence for depositing an oxynitride film. In the sequence shown in FIG. 8B, the oxynitride film is deposited by additionally introducing ammonia in the deposition process.

In FIG. 8A and FIG. 8B, "DEPOSITION GAS" indicates a source gas for a metal compound, and "OXIDIZING AGENT" indicates oxygen or a gaseous chemical compound containing oxygen. An example of the process sequence illustrated in FIG. 8A, employing $Zr(N(CH_3)(C_2H_5))_4$ for the deposition gas, nitric monoxide (NO) for the gaseous oxidizing agent and an inert gas for the purge gas, will be described below.

Firstly, $Zr(N(CH_3)(C_2H_5))_4$ is supplied into a chamber of an ALD apparatus as a source material to cause a chemical reaction with a surface of a lower electrode, thereby depositing a single atomic layer thereon. Next, the supply of $Zr(N(CH_3)(C_2H_5))_4$ is stopped, and then, an inert gas, typical example of which include $N_2$, Ar or the like, is introduced into the chamber as a purge gas to purge or flush the excess amount of unreacted $Zr(N(CH_3)(C_2H_5))_4$ out.

Then, NO is supplied therein to remove functional group that terminates Zr deposited on the substrate. Then, the supply of NO is stopped, and an inert gas, typical example of which include $N_2$, Ar or the like, is introduced therein as a purge gas to purge or flush unreacted NO and/or reaction byproducts, and then the supply of the purge gas is stopped.

As described above, a desired number of the sequential process cycle consisting of the supply of $Zr(N(CH_3)(C_2H_5))_4$, the first purge, the supply of NO and the second purge are repeated to obtain a high dielectric constant film providing lower leakage current and having better film quality, consisting of $ZrO_xC_yN_z$ having a film thickness of 5 to 15 nm (where x, y and z are selected so as to satisfy $0<x$, $0.1 \leq y \leq 1.25$, $0.01 \leq z$ and $x+y+z=2$).

Next, status of an operation for depositing a thin film on the semiconductor wafer employing the vapor phase deposition apparatus 100 shown in FIG. 1 according to the present embodiment will be described. It is noted that FIG. 1 illustrates a status of opening and closing the valve, which corresponds to the status in the step 1 shown in FIG. 5. The opening/closing status of the valve is distinguished in the figures by means of providing pattern, and more specifically, a patterned valve indicates to be in the closing status, and unpatterned valve indicates to be in the opening status. TEMAZ gas, which is generated by being vaporized in the vaporizer 202, is supplied to the chamber 1060 through the piping unit 120, and introduced into the reaction chamber 1060 via the perforations 110 of the shower head 108.

The first source gas (TEMAZ gas) introduced in the chamber 1060 reacts with an upper portion of the wafer 104 mounted on the supporting member 102. Since the valve 158 is opened, byproducts generated after the reaction and the unreacted source gas are transferred through the outlet piping 140, the valve 158 and the outlet piping 142 in this order and are eventually exhausted out from the outlet port 146. In this occasion, since the valve 154 along the source material supplying piping 130 is closed, a second source gas, description of which will be made later, is not supplied. In addition, since the valve 156 along the purge gas supplying piping 136 is also closed, a purge gas, description of which will be made later, is not supplied.

Here, while the source material in the source material container 112 is not particularly limited in the step 1, when high dielectric constant film is formed, a source material containing a chemical compound including Hf or Zr, such as $HfO_2$, $ZrO_2$ and the like, for example, may be preferably employed.

Particularly preferable chemical compound including Hf or Zr may be a chemical compound containing Hf or Zr, N and a hydrocarbon group, and the source material containing such compound may be preferably employed. Such chemical compound may be, for example, a compound having a general formula of: $M(NRR')_4$ (where M contains at least one of Hf and Zr, and R and R' are same or different hydrocarbon group(s)). R and R' may preferably be alkyl group having 6 or less carbons/carbon, and more specifically, methyl group, ethyl group, propyl group, tertiary butyl group or the like may be employed. The use of such compounds provides stable deposition of the high dielectric constant film. In addition, the use of such compounds also inhibits a contamination of particles derived from the source material of the deposition gas, and thus further improvement in the film quality of the deposited high dielectric constant film can be achieved.

More specifically, the preferable compounds may be: $Zr(N(C_2H_5)_2)_4$ (tetra diethyl amino zirconium, TDEAZ) or $Zr(NCH_3C_2H_5)_4$ (TEMAZ) or the like. Selection of such chemical compounds may provide a film having a flat and smooth surface, and prevent a contamination of particles in the film. As a result, the high dielectric constant film providing lower leakage current and having better film quality can be obtained.

CVD or ALD are conducted via the later-described process utilizing the above-described source materials, so that a thin film comprising $ZrO_xC_yN_z$ (where x, y and z are selected to satisfy $0<x$, $0.1 \leq y \leq 1.25$, $0.01 \leq z$ and $x+y+z=2$) is obtained. Thin film having such specified composition provides higher capacity and is considerably reduced leakage current. Therefore, the film can be preferably employed for a capacitor film in a capacitance device, a gate insulating film in a gate electrode of a transistor and the like.

Figure 2:
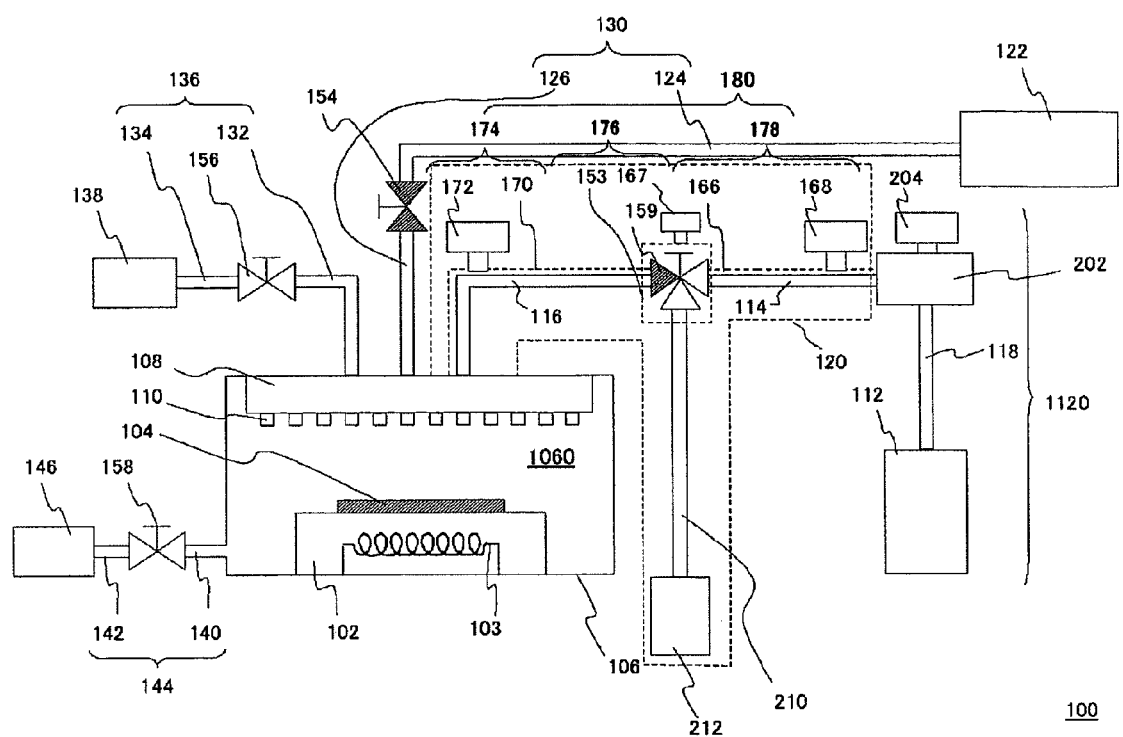
FIG. 2 is a schematic cross-sectional view of the vapor phase deposition apparatus of the embodiment according to the present invention, illustrating a configuration in introducing a purge gas.

FIG. 2 schematically illustrates a status of the vapor phase deposition apparatus 100 according to the present embodiment during the introduction of the purge gas in the step 2 and the step 4 shown in FIG. 5. After completing the introduction of the first source gas shown in FIG. 1, a purge gas is introduced therein, as shown in FIG. 2. The vapor phase deposition apparatus 100 shown in FIG. 2 has substantially the same configuration as the configuration of the vapor phase deposition apparatus 100 shown in FIG. 1, except that the valve 159 in the piping unit 120 communicates with the source material outlet piping 210. Thus, the supply of the first source gas into the chamber 1060 is stopped. Therefore, when the valve 159 is closing the communication between the second piping 114 and the first piping 116, the first source gas remaining in the second piping 114 can be exhausted to the outside of the piping unit 120. Therefore, a decomposition of the residual first source gas remaining in the second piping 114 can be inhibited.

On the other hand, since the valve 156 along the purge gas supplying piping 136 is opened, the purge gas remaining in the purge gas inlet 138 is transported through the piping 134, the valve 156 and the piping 132 in this order, and is introduced into the chamber 1060 surrounded by the chamber walls 106 from the perforations 110 of the shower head 108.

Since the valve 158 is opened, the purge gas introduced into the chamber 1060 flushes or purges the residual first source gas remained in the chamber 1060 out, and the flushed residual first source gas is transported through the outlet piping 140, the valve 158 and the outlet piping 142 in this order to be exhausted from the outlet port 146.

Figure 3:
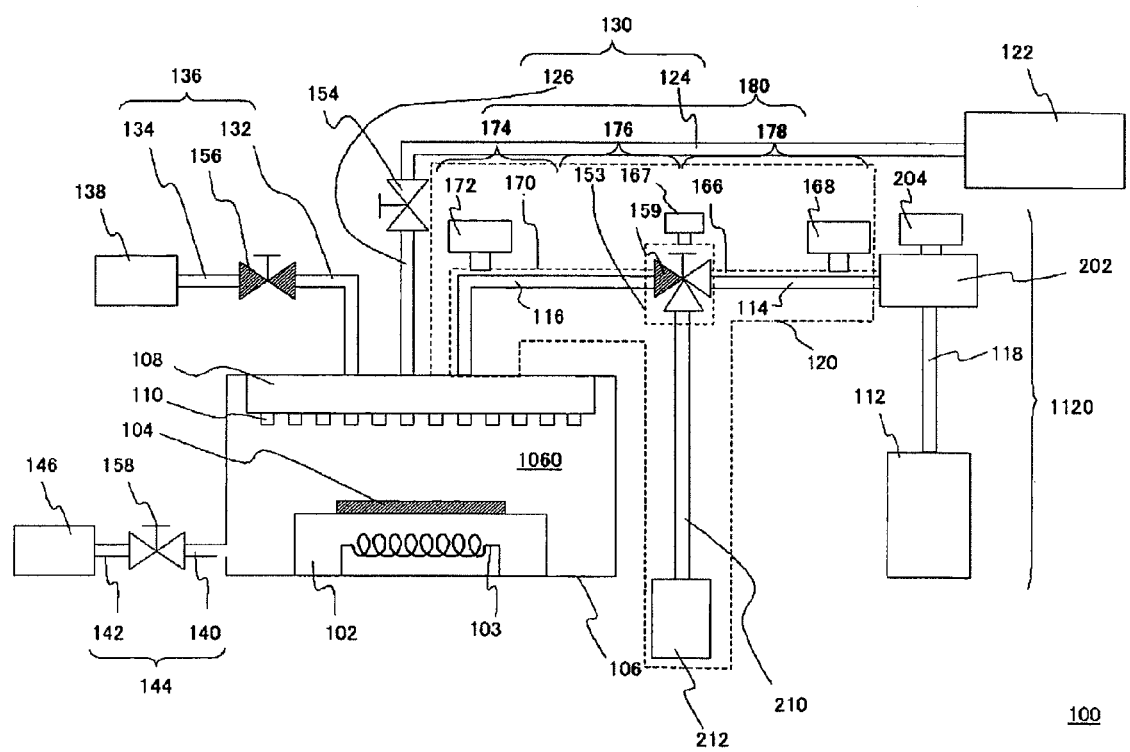
FIG. 3 is a schematic cross-sectional view of the vapor phase deposition apparatus of the embodiment according to the present invention, illustrating a configuration in introducing a second source gas.

FIG. 3 schematically illustrates a status of the vapor phase deposition apparatus 100 according to the present embodiment during the introduction of the second source gas. The introduction of the second source gas corresponds to the step 3 in FIG. 5. After completing the introduction of the purge gas shown in FIG. 2, the second source gas is introduced therein, as shown in FIG. 3. The vapor phase deposition apparatus 100 shown in FIG. 3 has substantially the same configuration as the configuration of the vapor phase deposition apparatus 100 shown in FIG. 1, except that the valve 159 in the piping unit 120 communicates with the source material outlet piping 210. Thus, the supply of the first source gas into the chamber 1060 is stopped.

Further, the Valve 156 along the purge gas supplying piping 136 is also closed. Thus, the supply of the purge gas is also stopped.

On the other hand, since the valve 154 along the source material supplying piping 130 is opened, the second source gas contained in the second source material container 122 is transported through the piping 124, the valve 154 and the piping 126 in this order, and is introduced into the chamber 1060 from the perforations 110 of the shower head 108.

The second source gas introduced in the chamber 1060 reacts with an upper portion of the wafer 104 mounted on the supporting member 102. Since the valve 158 is opened, byproducts after reaction and unreacted second source gas are transferred through the outlet piping 140, the valve 158 and the outlet piping 142 in this order and are eventually exhausted via the outlet port 146.

When the thin film having higher dielectric constant is formed by utilizing a source gas containing a chemical compound including Hf or Zr as a first source gas, it is preferable to employ an oxidizing gas as the second source gas. Typical oxidizing gas includes oxygen or a chemical compound including oxygen. More specifically, the typical compounds may be NO, $NO_2$, $N_2O$, $H_2O$, $O_2$, $O_3$ and the like. Among the compounds, NO, $NO_2$ and $N_2O$ are preferable, and a gaseous mixture of NO and $NO_2$ and a gaseous mixture NO and $O_3$, which represent combinations of nitriding gas and oxidizing gas, are relatively more preferable.

Stable deposition of the high dielectric constant film having better film quality can be obtained by selecting such compounds. Further, while $H_2O$ is comparatively easier to be remained within the chamber 1060 in the process employing $H_2O$ that has been frequently employed as an oxidizing gas, NO, $N_2O$ and $NO_2$ are easier to be removed from the inside of the chamber 1060 by purging, thereby improving the manufacturing efficiency.

When the first source gas is metal containing deposition gas and the second source gas is an oxidizing gas, it is preferable to select the volumetric ratio of these compounds (that is, metal containing deposition gas/oxidizing gas) is equal to or less than centesimal (1/100). Such volumetric ratio helps reducing impurities contained in the film.

When a gaseous mixture of NO and $NO_2$ is employed as an oxidizing gas, ratio of $NO/NO_2$ is preferably equal to or less than 1/10000. The pressure in the deposition process is, for example, within a range of from 10 mTorr to 10 Torr.

After the second source material is introduced into the chamber 1060, in the step 4 shown in FIG. 5, the purge gas is introduced in chamber and is then exhausted, as indicated in FIG. 2 The above-mentioned four steps are repeated by several ten times to several hundred times to deposit a film. In other words, the first source gas and the second source gas, which are different deposition source material, are alternately introduced into the chamber 1060 to grow an atomic layer deposition, thereby depositing a film.

Here, the deposition temperature for depositing the thin film on the upper portion of the wafer 104 mounted on the supporting member 102 in the case of employing $Zr(NRR')_4$ as the source material may be preferably 200 degree C. to 400 degree C., in both occasions of supplying the deposition gas including $Zr(NRR')_4$ and supplying the oxidizing gas described later. Contamination of the impurity to the thin film can be inhibited by selecting the deposition temperature of not lower than 200 degree C. Further, particle size of the crystallized particle is small and the leakage current can be reduced by selecting the deposition temperature of not higher than 400 degree C. The temperatures are controlled by the heater 103 provided within the supporting member 102.

The first source material having properties shown in the following Table 1 is mainly employed in the vapor phase deposition apparatus 100 according to the present embodiment, and thus the cases utilizing such material will be described below.

TABLE 1

| | (degree C.) | | | |
|---|---|---|---|---|
| | VAPORIZING TEMPERA- TURE (T1) @0.1 Torr | DECOM- POSITION TEMPERA- TURE (T2) | DECOM- POSITION TEMPERA- TURE (T3) | T2 − T1 |
| TEMAZ | 76 | 85 | 130 | 9 |
| TDEAZ | 79 | 90 | 140 | 11 |
| TEMAH | 83 | 95 | 140 | 12 |
| TDEAH | 96 | 105 | 150 | 9 |

A decomposition temperature (T3) is defined as a temperature, at which a change of color (change in quality) is caused in a moment of time due to a decomposition of the source material, and a decomposition temperature (T2) is defined as a temperature, at which a very lower level of a decomposition is caused and a detection of a lower amount of particles is started in the deposition process due to the very lower level of a decomposition. Larger amount of the decomposition is occurred at the temperature of T3 than that at the temperature of T2. The "decomposition temperature" indicates T2 in the following descriptions, unless otherwise instructed.

Results of the measurements for the temperatures of the second piping 114, the first piping 116 and the valve 159 in the vapor phase deposition apparatus 100 according to the present embodiment, in the case that the power applied to the valve 159 along the piping unit 120 for supplying the first source material is changed, are shown in Table 2.

TABLE 2

| FIRST PIPING 116 and SECOND PIPING 114 | POWER PRESET (W) | 7 | 8 | 9 | 10 | 11 | 12 |
|---|---|---|---|---|---|---|---|
| | MEASURED TEMPERATURE (degree C.) | 70 | 80 | 90 | 100 | 110 | 120 |
| VALVE 159 | POWER PRESET (W) | 10 | 11 | 12 | 13 | 14 | 15 |
| | MEASURED TEMPERATURE (degree C.) | 70 | 80 | 90 | 100 | 110 | 120 |

The temperature of the valve 159 could be maintained to be substantially the same as the temperatures of the second piping 114 and the first piping 116, only after applying higher electric power to the temperature control unit than the power applied to the second piping 114 and the first piping 116.

Concerning the temperature of the vaporizer 202 in the case of employing TEMAZ as the first source material, since a vaporizing temperature thereof (T1) at 0.1 Torr is 76 degree C. and a decomposition temperature thereof (T2) is 85 degree C., the temperature of the vaporizer is controlled within a range of from 60 degree C. to 85 degree C., for example. Here, the vaporization thereof can be occurred even if the temperature of the vaporizer 202 is lower than the vaporizing temperature (T1) of the source material to some extent, and thus the source gas can be supplied under such condition. Further, the temperature of the piping unit 120 is controlled to be higher than the temperature of the vicinity of the vaporizer outlet port.

Since the decomposition temperature (T2) of TEMAZ that is a critical temperature for generating the particles is 85 degree C. and the vaporization temperature (T1) thereof is 76 degree C., the temperature of the valve 159 provided along the piping unit 120 is controlled within a range of from 80 degree to 100 degree, for example. More specifically, such temperature is controlled to be within a range of from a temperature that is not lower than the vaporization temperature (T1) to a temperature that is the decomposition temperature (T2) plus 20 degree C. Values of electric power presets for respective temperature control units (that is, the first temperature control unit 174, the second temperature control unit 176 and the third temperature control section 178) and the corresponding measured temperatures are shown in Table 3.

TABLE 3

| | | FIRST PIPING 116 | VALVE 159 | SECOND PIPING 114 | VAPOR- IZER 202 |
|---|---|---|---|---|---|
| EXAM- PLE 1 | POWER PRESET (W) | 9 | 12 | 9 | — |
| | MEASURED TEMPERATURE (degree C.) | 90 | 90 | 90 | 80 |
| EXAM- PLE 2 | POWER PRESET (W) | 8 | 11 | 8 | — |
| | MEASURED TEMPERATURE (degree C.) | 80 | 80 | 80 | 80 |
| EXAM- PLE 3 | MEASURED TEMPERATURE (degree C.) | 90 | 90 | 85 | 80 |
| EXAM- PLE 4 | MEASURED TEMPERATURE (degree C.) | 95 | 90 | 85 | 80 |

Example 1 represents a case that all the temperatures in the piping unit 120 are equal and higher than the temperature of the vaporizer 202, Example 2 represents a case that the temperature of the vaporizer 202 and the temperatures in the piping unit 120 are equal, Example 3 represents a case that the temperature of the valve 159 is equal to the temperature of the first piping 116 and a temperature gradient is generated from the vaporizer 202 to the chamber 1060 in the control temperatures, and Example 4 represents a case that a temperature gradient is generated for all the control temperatures from the vaporizer 202 to the chamber 1060. While there may be a case where the piping temperature on the side of the chamber 1060 is higher than the decomposition temperature, the source gas usually flows toward the chamber 1060 or the outlet port 212 and thus the immediate decomposition of the source material hardly occurs even if the temperature therein is higher than the decomposition temperature. Therefore, the condensation of the source material can be inhibited while inhibiting the decomposition of the source material in each of the above-described cases, that are, the case that all the temperatures of the first piping 116, the valve 159 and the second piping 114 are equal (Example 1 and Example 2), the case that the temperature of the first piping 116 is equal to the temperature of the valve 159 and the temperature of the first piping 116 and the temperature of valve 159 are higher than the temperature of the second piping 114 (Example 3) and the case that the temperature of the first piping 116 is higher than the temperature of the valve 159 and the temperature of the valve 159 is higher than the temperature of the second piping 114 (Example 4).

Here, the preset temperatures may more preferably form a temperature gradient that gradually elevates from the vaporizer 202 to the first piping 116. This is because, even though there is an insufficiently heated portion in the respective parts (second piping 114, valve 159 and first piping 116), the condensation of the source material in the insufficiently heated portion can be inhibited by setting higher temperature than the vaporizer 202. Further, it is preferable to control the first piping 116 to maintain the temperature of the first piping 116 that is sufficiently high but not higher than the decomposition temperature of the source material, since the purge in the pipings can be easily carried out at such temperature, and further, even if the source material is remained within the piping, the generation of the particles due to the decomposition of the residual source material by the passage of time or due to the mixing of the gases released within the chamber 1060 by an inappropriate step in the deposition process can be avoided. In these reasons, the case of the Example 4 is more preferable shown in Table 3, for example.

An experiment for investigating number of particles generated on the deposited thin film employing vapor phase deposition apparatus 100 according to the present embodiment under a condition of changing the temperature by changing electric power to the valve 159 was conducted. In order to investigate an influence of the temperature of the valve 159 on the generation of the particles, the temperature presets of the respective regions in the piping unit 120 except the valve 159 were presented as the Example 1 shown in Table 3, and as a standard condition, the temperatures of the second piping 114, the first piping 116 and the valve 159 were set to be identical. Further, the process for manufacturing the thin film was that described in the present embodiment.

Figure 6:
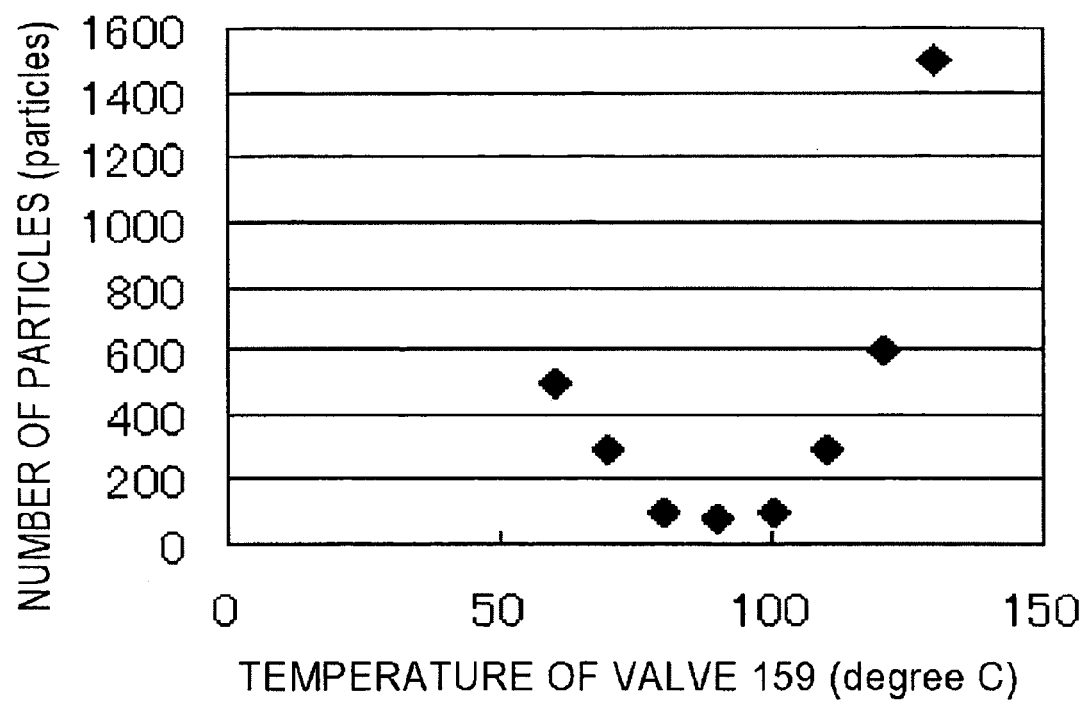
FIG. 6 is a graph, showing a relationship of the valve temperature with number of particles in the case of forming the thin film with TEMAZ gas.

Results of the experiments conducted by utilizing TEMAZ are shown in FIG. 6.

As shown in FIG. 6, in the range of the temperature of the valve 159 of from 80 degree C. to 100 degree C., the number of the particles in the metal compound could be reduced to a level of not higher than 300 particles/wafer (200 mm wafer) (that is, 0.95 particle/1 cm$^2$), which is a reference value that can preferably be used as the high dielectric constant film.

It is also considered in the conventional apparatus having the configuration as described in Japanese Patent Laid-Open No. 2000-282,242 that the temperatures of the whole piping unit including valve are adjusted to be higher in view of the temperature of the valve to similarly provide an inhibition of the condensation of the source gas. However, in such case, the temperature in the piping easily becomes too high, so that the source gas may be decomposed within the pipings, thereby providing a possible cause for the particle generation.

On the contrary, in the apparatus of the present embodiment, the generation of the particles is inhibited as described in the following description.

The vapor phase deposition apparatus 100 according to the present embodiment is a type of a vapor phase deposition apparatus 100 for forming a thin film as described above, and comprises a chamber 1060, a piping unit 120 for supplying a source material of a thin film into the chamber 1060 in a gaseous condition, a vaporizer 202 that is capable of vaporizing the source material contained in a source material container 112 to supply the vaporized material into the piping unit 120, and a temperature control unit 180. The temperature control unit 180 comprises: a first temperature control unit 174, which is composed of a heater controller unit 172 and a tape heater 170 and is capable of controlling the temperature of the first piping 116 in the piping unit 120 that is directly connected to the chamber 1060; a second temperature control unit 176, which is composed of a heater controller unit 168 and a tape heater 166 and is capable of controlling the temperature of the second piping 114 that is connected to the vaporizer; and a third temperature control unit 178, which is composed of a heater controller unit 167 and a thermostatic chamber 153 and is capable of controlling the temperature of the valve 159.

A component having larger volume and thus being difficult to be heated, like the valve 159, tends to be cooled. Such reduction in temperature causes the condensation of the source material in the cooled portion, and then the decomposition thereof is caused, and eventually generating the particles. In the present embodiment, larger electric power for heating is applied to the valve 159 than the power applied to the first piping 116 and the second piping 114 to maintain the temperature of the valve 159 at the same temperature as the temperature of the second piping 114 and the first piping 116, thereby improving the purging efficiency. Thus, the generation of the particles can be avoided.

More specifically, in the present embodiment, the valve 159 between the first piping 116 and the second piping 114 in the piping unit 120 is housed within the thermostatic chamber 153 (equivalent to the tape heater) separately from the tape heater 170 and the tape heater 166 and is controlled by the heater controller unit 167, and larger electric power for heating is applied thereto to control the temperature of the first piping 116 at the same temperature as the temperature of the second piping 114.

Here, the source material, which is particularly illustrated in the example employed in the present embodiment, is characterized in the relation ship of:

decomposition temperature ($T2$)–vaporization temperature ($T1$)<20 degree C., that is, there is a limitation in the value of $T2$, and thus it is difficult to control the temperature of the first piping 116 at sufficiently higher temperature. This is because higher temperature of the first piping 116 than $T2$ provides larger probability that the particles are generated by the decomposition of the source gas. Further, since the vapor pressure is also lower, it is difficult to conduct the purge after the source material is passed, and thus it is prone to remain in the piping. The residual source material remained in the piping may be decomposed in passage of time, or may be released within the chamber 1060 by an inappropriate step in the deposition process to be mixed with the gases, thereby causing the generation of the particles.

The unpurged residual materials were remained in the valve and the piping when the temperature of the valve 159 was lower than 80 degree C., these materials were decomposed as time passes, or the mixing of the gases was occurred due to the release thereof into the chamber by an inappropriate step in the deposition process, to generate the particles. Further, the source materials were decomposed in very short time within the piping when the temperature of the valve 159 was higher than 100 degree C., and thus the decomposed materials became the particles.

The use of the vapor phase deposition apparatus 100 according to the present embodiment allows to suitably control the temperature within the piping unit 120 so as not to decrease the temperature of the portion of the valve 159, and the temperature control for the piping unit 120 can be conducted by utilizing such procedure in accordance with the characteristics of the deposition source material, thereby inhibiting the generation of the particles and providing the stable deposition of the thin film.

Second Embodiment

An experiment for investigating number of particles generated on the deposited thin film employing vapor phase deposition apparatus 100 described in the first embodiment and employing various types of amino acids including TEMAZ as the first source material, under a condition of changing the temperature by changing electric power to the valve 159, was conducted. The temperature presets of the respective regions in the piping unit 120 except the temperature of the valve 159 were presented as shown in Table 4. Further, the process for manufacturing the thin film was that described in the first embodiment.

TABLE 4

|  | PIPING UNIT 120 (EXCLUDING VALVE 159) | VAPORIZER 202 |
|---|---|---|
| TEMAZ | 80 degree C. to 100 degree C. | 60 degree C. to 85 degree C. |
| TDEAZ | 85 degree C. to 105 degree C. | 65 degree C. to 90 degree C. |
| TEMAH | 90 degree C. to 110 degree C. | 70 degree C. to 95 degree C. |
| TDEAH | 100 degree C. to 120 degree C. | 80 degree C. to 105 degree C. |

Figure 7:
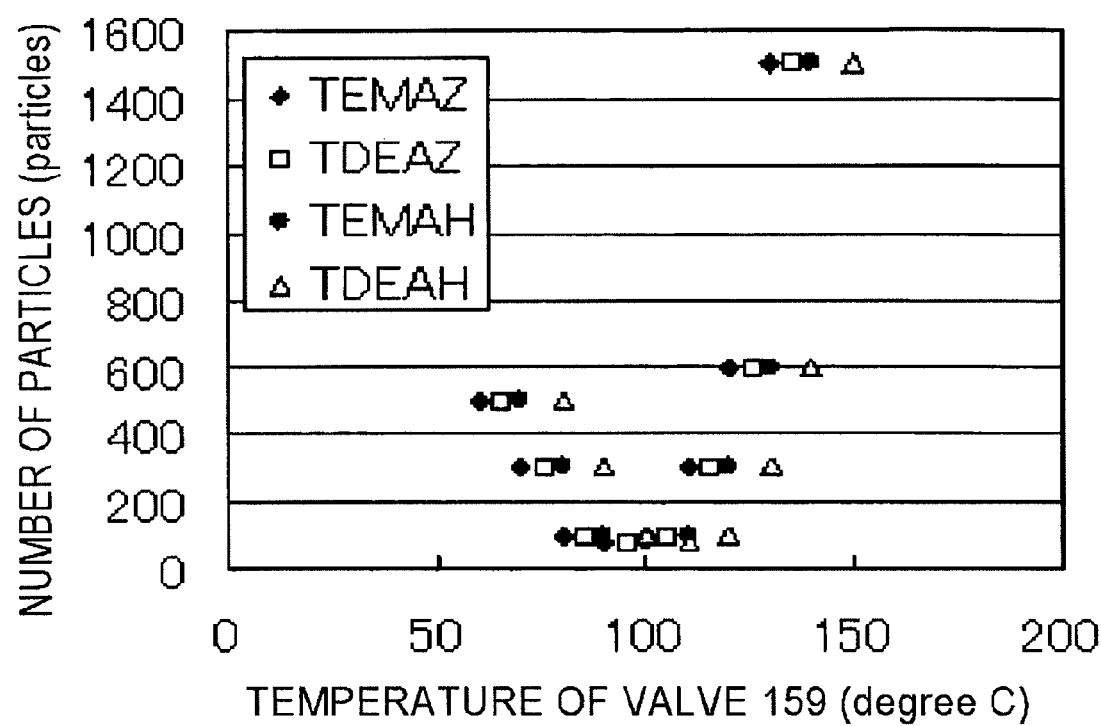
FIG. 7 is a graph, showing a relationship of the valve temperature with number of particles in the case of forming the thin film with various types of gases.

Results of the experiments conducted for the amino acids including TEMAZ is shown in FIG. 7.

As shown in FIG. 7, in the case of utilizing TEMAZ, the number of the particles in the metal compound could be reduced to a level of not higher than 300 particles/wafer (200 mm wafer)(that is, 0.95 particle/1 cm$^2$), which is a reference value that can preferably be used as the high dielectric constant film, in the range of the temperature of the valve 159 of from 80 degree C. to 100 degree C.

Further, in the case of utilizing TDEAZ, the number of the particles in the metal compound could be reduced to a level of not higher than 300 particles/wafer (200 mm wafer)(that is, 0.95 particle/1 cm$^2$), which is a reference value that can preferably be used as the high dielectric constant film, in the range of the temperature of the valve 159 of from 85 degree C. to 105 degree C.

Further, in the case of utilizing TEMAH, the number of the particles in the thin film could be reduced to a level of not higher than 300 particles/wafer (200 mm wafer)(that is, 0.95 particle/1 cm$^2$), which is a reference value that can preferably be used as the high dielectric constant film, in the range of the temperature of the valve 159 of from 90 degree C. to 110 degree C.

Further, in the case of utilizing TDEAH, the number of the particles in the thin film could be reduced to a level of not higher than 300 particles/wafer (200 mm wafer)(that is, 0.95 particle/1 cm$^2$), which is a reference value that can preferably be used as the high dielectric constant film, in the range of the temperature of the valve 159 of from 100 degree C. to 120 degree C.

As such, a precise temperature control in the valve 159 is conducted for the source material having the relationship of the vaporization temperature and decomposition temperature, in which the temperature difference therebetween is within 20 degree C., and the temperature of the piping unit 120 is preset to be equal to or higher than the vaporization temperature (T1) and equal to or less than a temperature that is the decomposition temperature (T2) plus 20 degree C., and therefore the temperature control of the piping unit 120 can be conducted in accordance with the characteristics of the source material, thereby inhibiting the generation of the particles. This provides the stable deposition of the thin film.

Third Embodiment

Figure 4:
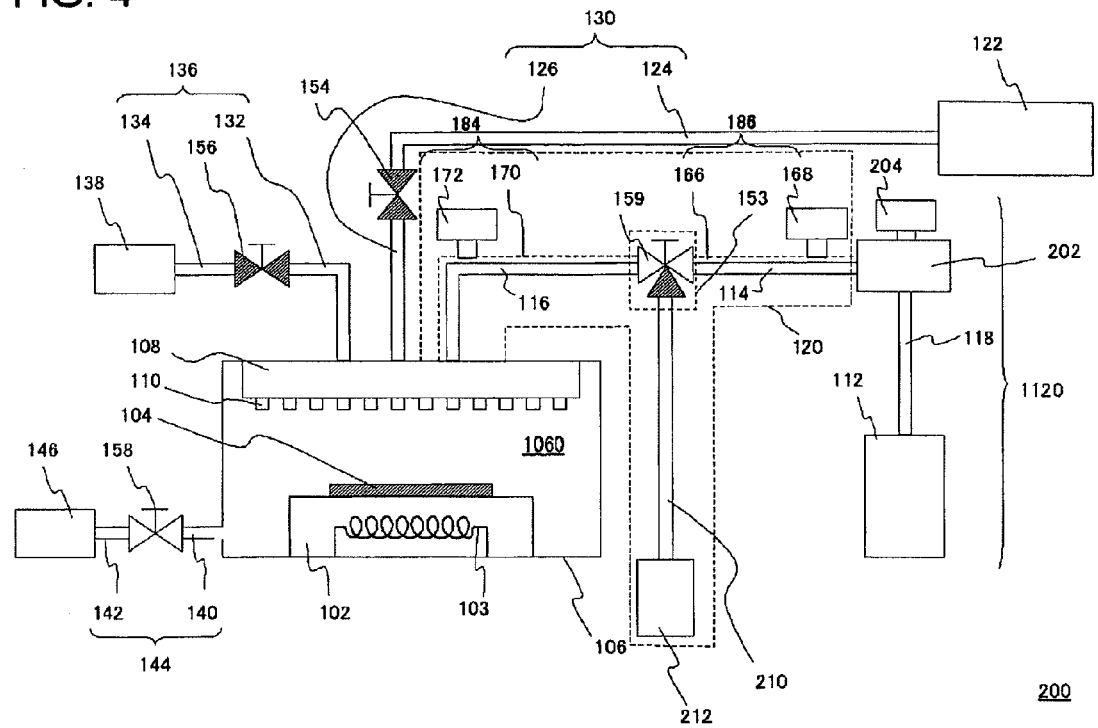
FIG. 4 is a schematic cross-sectional view of the vapor phase deposition apparatus of the embodiment according to the present invention, illustrating a configuration in introducing a first source gas.

FIG. 4 schematically illustrates a status of the vapor phase deposition apparatus 200 according to the present embodiment during the introduction of the first source gas.

The vapor phase deposition apparatus 200 in the present embodiment has substantially the same configuration as the configuration of the vapor phase deposition apparatus 100 according to the first embodiment, except that the temperature of the valve 159 between the second piping 114 and the first piping 116 is controlled by the same heater that is also used for controlling the temperature of the first piping 116.

The vapor phase deposition apparatus 200 comprises, in the piping unit 120 for supplying the first source material: a first temperature control unit 184, which is composed of a heater controller unit 172 and a tape heater 170 and is capable of controlling the temperature of the first piping 116 and the valve 159; and a second temperature control unit 186, which is composed of a heater controller unit 168 and a tape heater 166 and is capable of controlling the temperature of the second piping 114.

Values of electric power presets in the case of employing the vapor phase deposition apparatus 200 according to the present embodiment and employing TEMAZ as the first source material for respective temperature control units (that is, the first temperature control unit 184 and the second temperature control unit 186) and the corresponding measured temperatures are shown in Table 5.

TABLE 5

| | | FIRST PIPING 116 and VALVE 159 | SECOND PIPING 114 | VAPOR-IZER 202 |
|---|---|---|---|---|
| EXAMPLE 1 | POWER PRESET (W) | 14 | 8 | — |
| | MEASURED TEMPERATURE (degree C.) | 100 | 80 | 80 |
| EXAMPLE 2 | POWER PRESET (W) | 13 | 8 | — |
| | MEASURED TEMPERATURE (degree C.) | 90 | 85 | 80 |

Similarly as in the first embodiment, the preset temperatures may more preferably form a temperature gradient that gradually elevates from the vaporizer 202 to the first piping 116. This is because, even though there is an insufficiently heated portion in the respective parts (first piping 116, valve 159 and second piping 114), the condensation of the source material in the insufficiently heated portion can be inhibited by setting higher temperature than the vaporizer 202.

Further, it is desirable to control the first piping 116 to maintain the temperature of the first piping 116 that is sufficiently high but not higher than the decomposition temperature of the source material, since the purge in the pipings can be easily carried out at such temperature, and further, even if the source material is remained within the piping, the generation of the particles due to the decomposition of the residual source material by the passage of time or due to the mixing of the gases released within the chamber 1060 by an inappropriate step in the deposition process can be avoided, and for example, Example 2 is a more preferable in Table 5.

In the vapor phase deposition apparatus 200 according to the present embodiment, the same tape heater 170 is employed to control the temperatures of the first piping 116 and the valve 159 to maintain the temperatures thereof at higher temperature than that of the second piping 114. The decrease of the temperature of the valve 159 in the piping unit 120 is inhibited and the condensation and the decomposition of the source gas at the valve 159 in the piping unit 120 is inhibited to prevent the generation of the particles, and thereby providing stable deposition of the thin film.

Fourth Embodiment

The present embodiment illustrates an example of applying the present invention to a metal oxide semiconductor field effect transistor (MOSFET). The MOSFET according to the present embodiment has a structure shown in FIG. 9. The transistor shown in FIG. 9 comprises, on a silicon substrate 400, a gate electrode, which includes a multi-layered body of a gate insulating film composed of a multi-layered body of a silicon oxynitride film 402 and a thin film 404 on the silicon oxynitride film 402, and a gate electrode 406 composed of polysilicon. Side walls 410 composed of a silicon oxide film are formed on side faces of the gate electrode. A source and drain region 412 containing an impurity diffused therein are formed on the face of the silicon substrate 400 in both sides of the gate electrode.

The thin film 404 has a chemical composition represented by $HfO_xC_yN_z$ (where x, y and z are selected to satisfy $0<x$, $0.1 \leq y \leq 1.25$, $0.01 \leq z$ and $x+y+z=2$). Penetration of an impurity in the gate electrode to the silicon substrate can be effectively inhibited by employing such film.

Preferable source gas for the metal compound deposition may include $Hf(N(C_2H_5)_2)_4$, $Hf(N(CH_3)_2)_4$, $Hf(N(CH_3)(C_2H_5))_4$ and the like. Penetration of an impurity can be more effectively inhibited by employing such compound.

Figure 9:
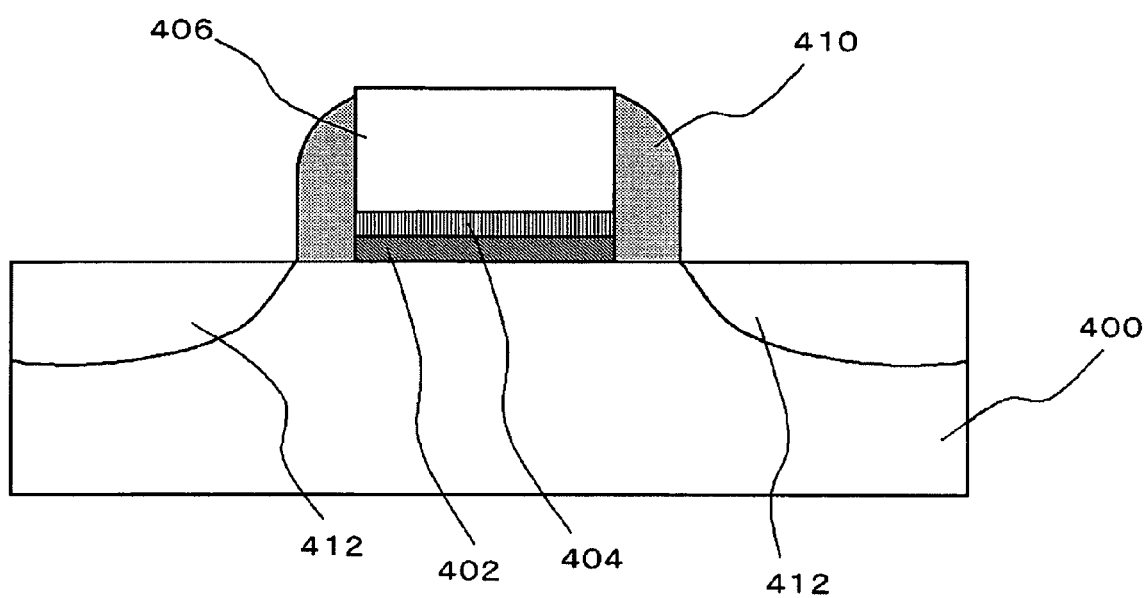
FIG. 9 is a schematic cross-sectional view showing a configuration of a transistor according to the embodiment.
Figure 10A:
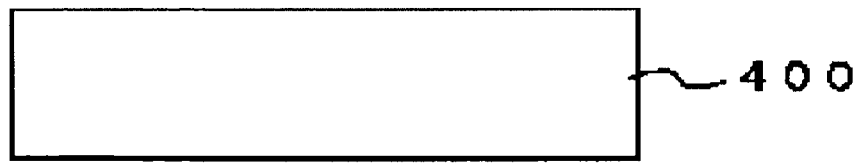
FIGS. 10A to 10D are cross-sectional views, for describing a manufacturing process for the transistor according to the embodiment.
Figure 10B:
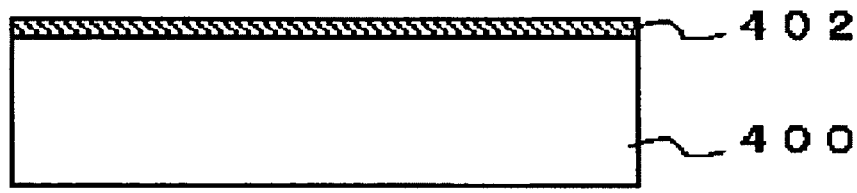
Figure 10C:
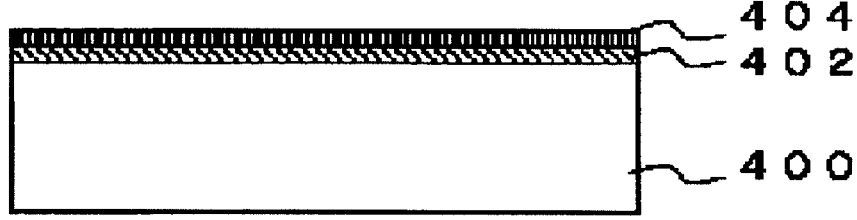

A manufacturing process for the transistor shown in FIG. 9 will be described in reference with FIGS. 10A to 10D and FIGS. 11E and 11F. In the beginning, as shown in FIG. 10A, a silicon substrate 400 that surface is cleaned by using a predetermined liquid chemical solution is prepared. Then, as shown in FIG. 10B, a silicon oxynitride film 402 is formed on a main surface of the silicon substrate 400 using a chemical vapor deposition (CVD) technique. Subsequently, as shown in FIG. 10C, a thin film 404 is formed using an atomic layer deposition (ALD) technique.

Among the deposition gases employing in this deposition process, a metal compound represented by a general formula of $Hf(NRR')4$ can be employed for a metal source gas (where R and R' are same or different hydrocarbon group(s), and preferably linear or branched alkyl group). R and R' may preferably be alkyl group having 6 or less carbons/carbon, and more specifically, methyl group, ethyl group, propyl group, tertiary butyl group or the like may be employed.

On the other hand, typical oxidizing gas employed for depositing the thin film 404 includes oxygen or a chemical compound containing oxygen. More specifically, the typical compounds may be $NO$, $NO_2$, $N_2O$, $H_2O$, $O_2$, $O_3$ and the like. Among these compounds, $NO$, $NO_2$ and $N_2O$ are preferable, and a gaseous mixture of $NO$ and $NO_2$ and a gaseous mixture of $N0$ and $O_3$, which represent combinations of nitriding gas and oxidizing gas, are more preferable. Stable deposition of the capacitor film having better film quality can be obtained by selecting such compounds. Further, $NO$, $N_2O$ and $NO_2$ are easier to be removed from the deposition apparatus by purging, thereby improving the manufacturing efficiency.

Here, the deposition process for the thin film 404 utilizes any one of the vapor phase deposition apparatus described in the first to the third embodiments. Further, the method for forming the thin film 404 also utilizes any one of the methods for forming the thin film described in the first to the third embodiments.

The supply of the deposition gas is conducted as follows, for example. Firstly, $Hf(N(CH_3)(C_2H_5))_4$ is supplied as a source material in a chamber of an ALD apparatus to cause a chemical reaction on a surface of a lower electrode in thin film, so that one atomic layer is deposited thereon. Next, the supply of $Hf(N(CH_3)(C_2H_5))_4$ is stopped, and then, an inert gas, typical example of which include $N_2$, Ar or the like, is introduced into the chamber as a purge gas to purge or flush the excess amount of unreacted $Hf(N(CH_3)(C_2H_5))_4$ out.

Then, NO gas is supplied therein to remove functional group that terminates Hf deposited on the substrate. Then, the supply of NO gas is stopped, and an inert gas, typical example of which include $N_2$, Ar or the like, is introduced therein as a purge gas to purge or flush unreacted NO and/or byproducts after reaction, and then the supply of the purge gas is stopped.

As described above, a desired number of the sequential process cycle consisting of the supply of $Hf(N(CH_3)(C_2H_5))_4$, the first purge, the supply of NO and the second purge are repeated to obtain the thin film 404 consisting of $HfO_xC_yN_z$ having a film thickness of 5 to 15 nm (where x, y and z are selected to satisfy $0<x$, $0.1 \leq y \leq 1.25$, $0.01 \leq z$ and $x+y+z=2$).

Figure 10D:
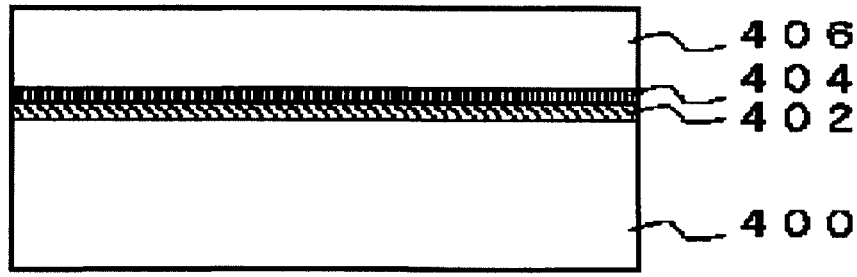

Thereafter, a gate electrode film 406 is formed on the thin film 404, as shown in FIG. 10D. It is preferable to employ polycrystalline silicon for the gate electrode film 406, and otherwise, a metal electrode such as SiGe, TiN, WN, Ni and the like can also be employed.

Figure 11E:
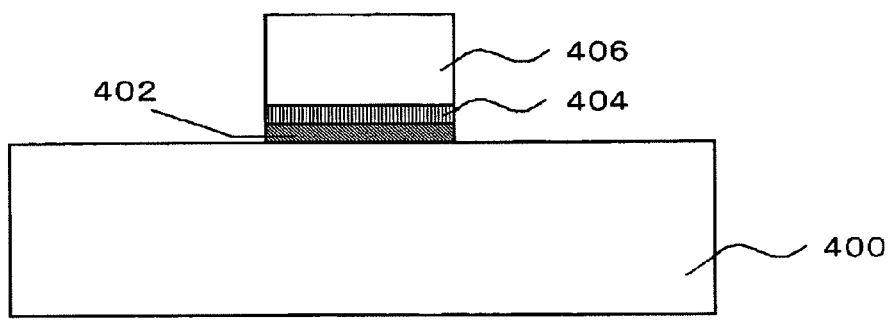
FIGS. 11E and 11F are cross-sectional views, for describing a manufacturing process for the transistor according to the embodiment.
Figure 11F:
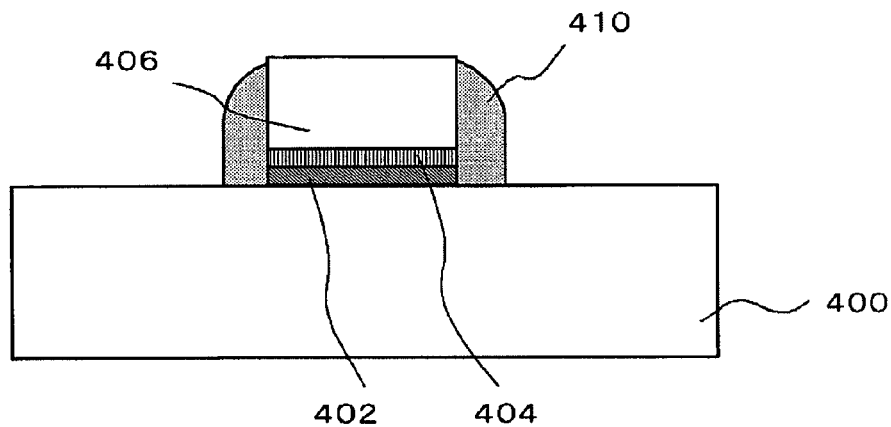

Subsequently, as shown in FIG. 11E, the silicon nitride 402, the thin film 404 and the gate electrode film 406 are etched to form a predetermined shape, thereby obtaining a gate electrode. Thereafter, side walls 410 are formed onto side faces of the gate electrode and an impurity is introduced into the gate electrode and the face of the silicon substrate 400 in both sides thereof. As described above, the MOSFET shown in FIG. 11F is manufactured.

Since the gate insulating film in the MOSFET according to the present embodiment includes the thin film 404, which is formed by employing the vapor phase deposition apparatus described in any of the first to the third embodiments and employing the process for forming the thin film described in any of the first to the third embodiments, the penetration of an impurity contained in the gate electrode film 406 through the gate insulating film into the silicon substrate 400 can be effectively prevented. Therefore, the transistors having higher reliability can be obtained.

Fifth Embodiment

Figure 12:
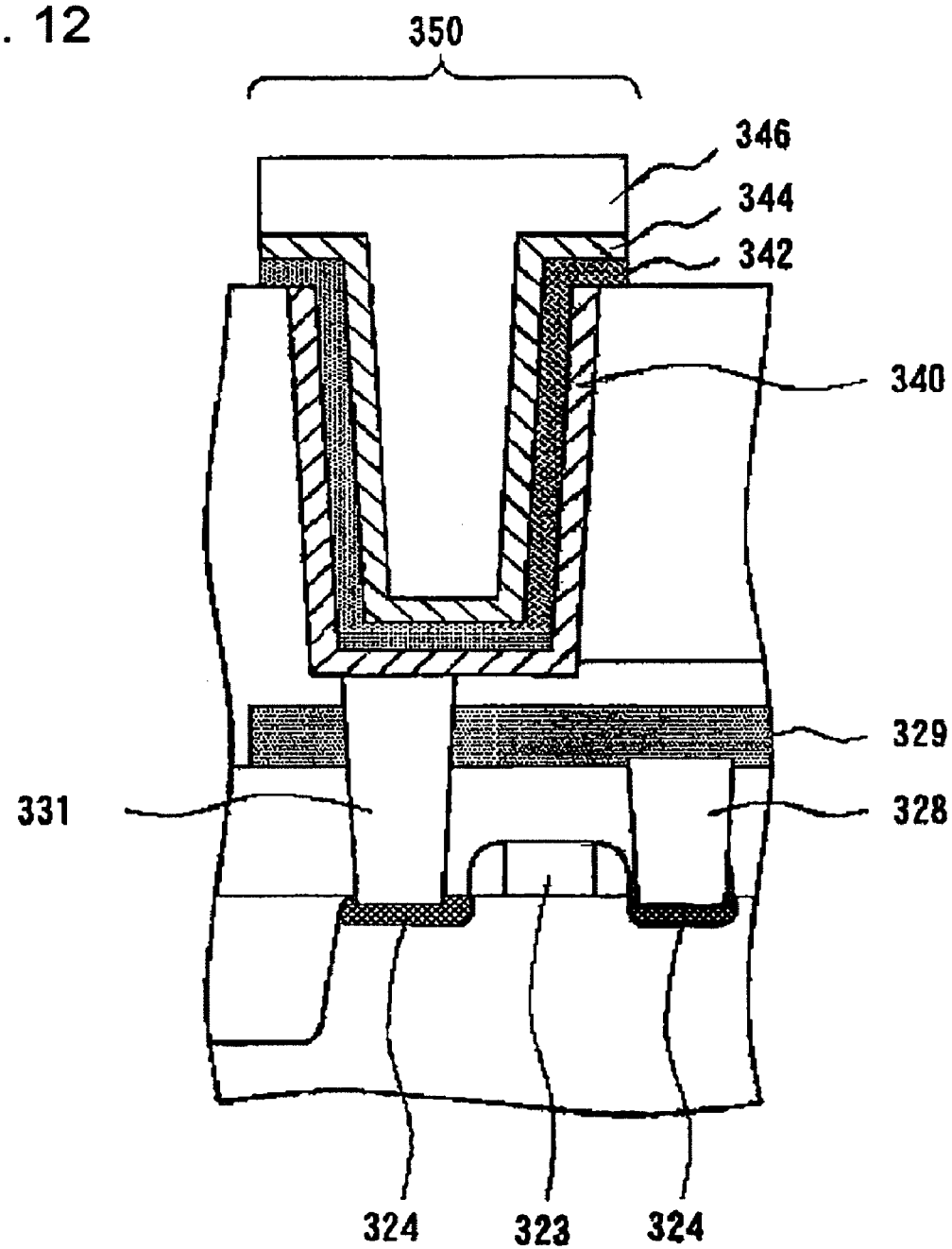
FIG. 12 is a cross-sectional view, for describing a manufacturing process for a capacitor according to the embodiment.

The present embodiment relates to a cylinder type metal-insulator-metal (MIM) capacitance device. FIG. 12 is a diagram showing a schematic configuration of a capacitance device according to the present embodiment. A cylinder type MIM capacitance device is provided on a transistor having a gate electrode 323 and a source drain region 324 through a capacitor contact 331.

The capacitance device has a multi-layered structure comprising a lower electrode (first electrode) 340, a capacitor film 342, an upper electrode 344 and a tungsten film 346, which are formed in this order and are patterned to a predetermined shape. Further, a bit line 329 is formed on the transistor through a cell contact 328.

Although the bit line 329 and the capacitor contact 331 are illustrated in the same cross-sectional view in FIG. 12, the illustration is made for helping to understand the whole structure thereof, and in reality, these do not intersect. More specifically, the bit line 329 is disposed within a gap in a region where the capacitor contact 331 is provided.

The deposition source materials for depositing the capacitor film 342 may include $Zr(N(C_2H_5)_2)_4$, $Zr(N(CH_3)_2)_4$, $Zr(N(CH_3)(C_2H_5))_4$ and the like. Selection of such chemical compounds provides a film having a flat and smooth surface and a prevention of a contamination of particles in the thin film. As a result, the capacitor film providing lower leakage current and having better film quality can be obtained.

Typical oxidizing gas employed for depositing the capacitor film 342 includes oxygen or a chemical compound containing oxygen. More specifically, the typical compounds may be $NO$, $NO_2$, $N_2O$, $H_2O$, $O_2$, $O_3$ and the like. Among these compounds, $NO$, $NO_2$ and $N_2O$ are preferable, and a gaseous mixture of $NO$ and $NO_2$ and a gaseous mixture of $NO$ and $O_3$, which represent combinations of nitriding gas and oxidizing gas, are more preferable. Stable deposition of the capacitor film having better film quality can be obtained by selecting such combination of gases.

Here, for the deposition process for the capacitor film 342 employing the above-described source materials, any one of the vapor phase deposition apparatus described in the first to the third embodiments is employed. Further, the method for forming the capacitor film 342 also utilizes any one of the methods for forming the thin film described in the first to the third embodiments.

While the embodiments of the present invention have been described above in reference to the annexed figures, it should be understood that the disclosures above are presented for the purpose of illustrating the present invention, and various configurations other than the above-described configurations can also be adopted.

For example, while the method for supplying the source material such as TEMAZ into the chamber 1060 in the above-described embodiment employs a down flow system, in which the shower head 108 is provided on the upper portion of the chamber 1060, another configuration, in which the shower head 108 is provided on a side of the chamber 1060, may alternatively be employed. Such alternative configuration also equally provides the inhibition to the generation and the condensation of a particle of the source gas such as TEMAZ according to the process for forming the thin film of the present invention, and therefore, similarly as in the above-described process, the high dielectric constant film having higher quality can be stably obtained.

While various types of amino acids including TEMAZ is employed as the source gas in the above-described embodiment, for example, other source gases having a vaporization temperature that is closer to a decomposition temperature may alternatively be employed. In such case, the use of the vapor phase deposition apparatus according to the present invention allows an accurate control of the temperature of the source material supplying piping in accordance with characteristics of the source gas, and thus the condensation or the decomposition of the source gas within the source material supplying piping can be inhibited, thereby similarly providing the thin film having improved quality.

It is apparent that the present invention is not limited to the above embodiment, that may be modified and changed without departing from the scope and spirit of the invention.

What is claimed is:

1. A method for forming a thin film on a substrate by employing a vapor phase deposition apparatus having a chamber, a piping unit including a vaporizing unit, a first piping connected to said chamber, a second piping connected to said vaporizing unit, a valve provided between said first piping and said second piping, and a temperature controlling unit that controls temperature of said piping unit,
   vaporizing a source material by using said vaporizing unit to generate a source gas;
   introducing said source gas from said vaporizing unit into said chamber through said piping unit; and
   depositing a thin film from said source gas in said chamber,
   wherein a temperature of said valve is controlled independently from a temperature of said first piping and said second piping, and is controlled to be within a range of from a temperature that is not lower than a vaporization temperature of said source gas and not higher than a temperature that is higher by 20° C. than a decomposition temperature of said source gas,
   wherein said first piping extends from an outlet of said valve to an inlet of said chamber, and said second piping extends from an outlet of said vaporizing unit to an inlet of said valve.

2. The method for forming a thin film according to claim 1, wherein said temperature control unit controls temperatures of said first piping and said valve at substantially same temperature.

3. The method for forming a thin film according to claim 1, wherein said temperature control unit controls temperatures of said first piping to be higher than said valve.

4. The method for forming a thin film according to claim 1, wherein said source material includes a chemical compound containing Hf or Zr.

5. The method for forming a thin film according to claim 1, wherein said source material includes a chemical compound containing Hf or Zr, N and hydrocarbon group.

6. The method for forming a thin film according to claim 1, wherein said source material is a chemical compound selecting from the group consisting of TEMAZ, TDEAZ, TEMAH and TDEAH.

7. The method for forming a thin film according to claim 1, wherein said temperature control unit controls temperatures of said valve equal to or more than 80° C. and equal to or less than 100° C. when said source material is TEMAZ.

8. The method for forming a thin film according to claim 1, wherein said temperature control unit controls temperatures of said valve equal to or more than 90° C. and equal to or less than 110° C. when said source material is TDEAZ.

9. The method for forming a thin film according to claim 1, wherein said temperature control unit controls temperatures of said valve equal to or more than 90° C. and equal to or less than 110° C. when said source material is TEMAH.

10. The method for forming a thin film according to claim 1, wherein said temperature control unit controls temperatures of said valve equal to or more than 100° C. and equal to or less than 120° C. when said source material is TDEAH.

11. A method for manufacturing a semiconductor device by employing a vapor phase deposition apparatus having a chamber, a piping unit including a vaporizing unit, a first piping connected to said chamber, a second piping connected to said vaporizing unit, a valve provided between said first piping and said second piping, and a temperature controlling unit that controls temperature of said piping unit,
vaporizing a source material by using said vaporizing unit to generate a source gas;
introducing said source gas from said vaporizing unit into said chamber through said piping unit; and
depositing a thin film from said source gas on a semiconductor wafer in said chamber,
wherein a temperature of said valve is controlled independently from a temperature of said first piping and said second piping, and is controlled to be within a range of from a temperature that is not lower than a vaporization temperature of said source gas and not higher than a temperature that is higher by 20° C. than a decomposition temperature of said source gas,
wherein said first piping extends from an outlet of said valve to an inlet of said chamber, and said second piping extends from an outlet of said vaporizing unit to an inlet of said valve.

12. The method for manufacturing a semiconductor device according to claim 11, wherein said thin film is depositing on SiON.

13. The method for manufacturing a semiconductor device according to claim 11, wherein said thin film is depositing on a lower metal electrode.

14. A method for manufacturing a semiconductor device by employing a vapor phase deposition apparatus having a chamber, a piping unit including a vaporizing unit, a first piping connected to said chamber, a second piping connected to said vaporizing unit, a valve provided between said first piping and said second piping, and a temperature controlling unit that controls temperature of said piping unit,
vaporizing a source material by using said vaporizing unit to generate a source gas;
introducing said source gas from said vaporizing unit into said chamber through said piping unit; and
depositing a thin film from said source gas on a semiconductor wafer in said chamber,
wherein a temperature of said valve is controlled independently from a temperature of said first piping and said second piping, and is controlled to be within a range of from a temperature that is not lower than a vaporization temperature of said source gas and not higher than a temperature that is higher by 20° C. than a decomposition temperature of said source gas,
wherein said first piping extends from an outlet of said valve to an inlet of said chamber, and said second piping extends from an outlet of said vaporizing unit to an inlet of said valve,
wherein said source material includes a chemical compound containing Hf or Zr.

15. A method for manufacturing a semiconductor device by employing a vapor phase deposition apparatus having a chamber, a piping unit including a vaporizing unit, a first piping connected to said chamber, a second piping connected to said vaporizing unit, a valve provided between said first piping and said second piping, and a temperature controlling unit that controls temperature of said piping unit,
vaporizing a source material by using said vaporizing unit to generate a source gas;
introducing said source gas from said vaporizing unit into said chamber through said piping unit; and
depositing a thin film from said source gas on a semiconductor wafer in said chamber,
wherein a temperature of said valve is controlled independently from a temperature of said first piping and said second piping, and is controlled to be within a range of from a temperature that is not lower than a vaporization temperature of said source gas and not higher than a temperature that is higher by 20° C. than a decomposition temperature of said source gas,
wherein said first piping extends from an outlet of said valve to an inlet of said chamber, and said second piping extends from an outlet of said vaporizing unit to an inlet of said valve,
wherein said source material includes a chemical compound containing Hf or Zr, N and hydrocarbon group.

16. A method for manufacturing a semiconductor device by employing a vapor phase deposition apparatus having a chamber, a piping unit including a vaporizing unit, a first piping connected to said chamber, a second piping connected to said vaporizing unit, a valve provided between said first piping and said second piping, and a temperature controlling unit that controls temperature of said piping unit,
vaporizing a source material by using said vaporizing unit to generate a source gas;
introducing said source gas from said vaporizing unit into said chamber through said piping unit; and
depositing a thin film from said source gas on a semiconductor wafer in said chamber,
wherein a temperature of said valve is controlled independently from a temperature of said first piping and said second piping, and is controlled to be within a range of from a temperature that is not lower than a vaporization temperature of said source gas and not higher than a temperature that is higher by 20° C. than a decomposition temperature of said source gas,
wherein said first piping extends from an outlet of said valve to an inlet of said chamber, and said second piping extends from an outlet of said vaporizing unit to an inlet of said valve,
wherein said source material is a chemical compound selecting from the group consisting of TEMAZ, TDEAZ, TEMAH and TDEAH.

17. A method for manufacturing a semiconductor device by employing a vapor phase deposition apparatus having a chamber, a piping unit including a vaporizing unit, a first piping connected to said chamber, a second piping connected to said vaporizing unit, a valve provided between said first piping and said second piping, and a temperature controlling unit that controls temperature of said piping unit, vaporizing a source material by using said vaporizing unit to generate a source gas;

introducing said source gas from said vaporizing unit into said chamber through said piping unit; and depositing a thin film from said source gas on a semiconductor wafer in said chamber, wherein a temperature of said valve is controlled independently from a temperature of said first piping and said second piping, and is controlled to be within a range of from a temperature that is not lower than a vaporization temperature of said source gas and not higher than a temperature that is higher by 20° C. than a decomposition temperature of said source gas, wherein said first piping extends from an outlet of said valve to an inlet of said chamber, and said second piping extends from an outlet of said vaporizing unit to an inlet of said valve, wherein said temperature control unit controls temperatures of said valve equal to or more than 80° C. and equal to or less than 100° C. when said source material is TEMAZ.

18. A method for manufacturing a semiconductor device by employing a vapor phase deposition apparatus having a chamber, a piping unit including a vaporizing unit, a first piping connected to said chamber, a second piping connected to said vaporizing unit, a valve provided between said first piping and said second piping, and a temperature controlling unit that controls temperature of said piping unit, vaporizing a source material by using said vaporizing unit to generate a source gas;

introducing said source gas from said vaporizing unit into said chamber through said piping unit; and depositing a thin film from said source gas on a semiconductor wafer in said chamber, wherein a temperature of said valve is controlled independently from a temperature of said first piping and said second piping, and is controlled to be within a range of from a temperature that is not lower than a vaporization temperature of said source gas and not higher than a temperature that is higher by 20° C. than a decomposition temperature of said source gas, wherein said first piping extends from an outlet of said valve to an inlet of said chamber, and said second piping extends from an outlet of said vaporizing unit to an inlet of said valve, wherein said temperature control unit controls temperatures of said valve equal to or more than 90° C. and equal to or less than 110° C. when said source material is TDEAZ.

19. A method for manufacturing a semiconductor device by employing a vapor phase deposition apparatus having a chamber, a piping unit including a vaporizing unit, a first piping connected to said chamber, a second piping connected to said vaporizing unit, a valve provided between said first piping and said second piping, and a temperature controlling unit that controls temperature of said piping unit, vaporizing a source material by using said vaporizing unit to generate a source gas;

introducing said source gas from said vaporizing unit into said chamber through said piping unit; and depositing a thin film from said source gas on a semiconductor wafer in said chamber, wherein a temperature of said valve is controlled independently from a temperature of said first piping and said second piping, and is controlled to be within a range of from a temperature that is not lower than a vaporization temperature of said source gas and not higher than a temperature that is higher by 20° C. than a decomposition temperature of said source gas, wherein said first piping extends from an outlet of said valve to an inlet of said chamber, and said second piping extends from an outlet of said vaporizing unit to an inlet of said valve, wherein said temperature control unit controls temperatures of said valve equal to or more than 90° C. and equal to or less than 110° C. when said source material is TEMAH.

* * * * *

UNITED STATES PATENT AND TRADEMARK OFFICE
CERTIFICATE OF CORRECTION

PATENT NO. : 8,304,021 B2  
APPLICATION NO. : 12/561836  
DATED : November 6, 2012  
INVENTOR(S) : Tomoe Yamamoto and Tomohisa Iino Page 1 of 1

It is certified that error appears in the above-identified patent and that said Letters Patent is hereby corrected as shown below:

In the Specifications

Column 1, Line 7, delete "Jan. 6, 2005" and insert -- Jun. 1, 2005 --.

Column 1, Line 9: delete "Feb. 6, 2004." and insert -- Jun. 2, 2004. --.

Column 6, line 47: delete "Zr (N(CH3)" and insert -- Zr(N(CH3) --.

Column 9, Line 49: Above "A decomposition" insert -- Here, "TEMAH" is an abbreviation of tetraethyl methyl amino hafnium, and "TDEAH" is an abbreviation of tetra diethyl amino hafnium. --.

Column 12, line 60: delete "relation ship" and insert -- relationship --.

Column 16, line 18: delete "Hf (NRR') 4" and insert -- Hf(NRR')$_4$ --.

Column 16, line 30: delete "N0" and insert -- NO --.

Signed and Sealed this  
Sixth Day of May, 2014

Michelle K. Lee  
*Deputy Director of the United States Patent and Trademark Office*